United States Patent
Fifield et al.

(10) Patent No.: US 6,177,817 B1
(45) Date of Patent: Jan. 23, 2001

(54) COMPENSATED-CURRENT MIRROR OFF-CHIP DRIVER

(75) Inventors: John A. Fifield, Underhill; Russell J. Houghton, Essex Jct.; Adam B. Wilson, Burlington, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/283,960

(22) Filed: Apr. 1, 1999

(51) Int. Cl.[7] .................................................. H03K 3/00
(52) U.S. Cl. ......................... 327/108; 112/380; 112/530; 112/537
(58) Field of Search ..................... 327/379, 380, 327/530, 538, 540, 537, 541, 108, 111, 362, 381

(56) References Cited

U.S. PATENT DOCUMENTS

| | | | |
|---|---|---|---|
| 4,533,839 | 8/1985 | Balakrishnan | 326/89 |
| 5,428,303 | 6/1995 | Pasqualini | 326/27 |
| 5,455,522 | 10/1995 | Jones | 326/27 |
| 5,568,084 | 10/1996 | McClure et al. | 327/538 |
| 5,581,197 | 12/1996 | Motley et al. | 326/30 |
| 5,640,122 | 6/1997 | McClure | 327/530 |
| 5,654,663 | 8/1997 | McClure et al. | 327/530 |
| 5,774,013 * | 6/1998 | Groe | 327/539 |

* cited by examiner

Primary Examiner—Dinh T. Le
(74) Attorney, Agent, or Firm—John J. Goodwin

(57) ABSTRACT

An off-chip driver circuit with compensated current source including a reference current amplifier and an output driver with a pull-up section. The reference current amplifier includes an input voltage Vcmn from an on chip current reference source. A reference current is established in the reference current amplifier by choosing the Beta of transistor in a current path. A feature of the circuit is that an output current is produced in the output lead of the driver circuit that is proportional to the current in the reference current amplifier, but with adjustments made for the supply voltage level and effective transistor channel length, Leff. Another feature of the circuit is that a reference current-voltage is established on the output lead of the reference current amplifier that is primarily determined by a multiple of the reference current but is reduced by a function of the supply voltage. In the circuit the output current of the driver is reduced linearly and predictably with the supply voltage.

12 Claims, 2 Drawing Sheets

COMPENSATED-CURRENT MIRROR OFF-CHIP DRIVER

BACKGROUND OF THE INVENTION

1. Field of the Invention

The present invention relates to semiconductor integrated circuit structures, and more particularly to an off-chip driver circuit for integrated circuits.

2. Background Art

U.S. Pat. No. 5,654,663 issued Aug. 5, 1997 to McClure et al. entitled CIRCUIT FOR PROVIDING A COMPENSATED BIAS VOLTAGE discloses a bias circuit for generating a bias voltage for a power supply voltage that comprises a voltage divider to generate a divided voltage based on a power supply value. The divided voltage is applied to a current mirror device which controls a current applied to a linear load device. The voltage across the load device determines the bias voltage.

U.S. Pat. No. 5,640,122 issued Jun. 17, 1997 to McClure entitled CIRCUIT FOR PROVIDING A BIAS VOLTAGE COMPENSATED FOR P-CHANNEL TRANSISTOR VARIATIONS discloses a bias circuit for generating a bias voltage that tracks power supply voltage variations that comprises a voltage divider to produce a ratioed voltage based on the power supply voltage to be tracked.

U.S. Pat. No. 5,581,197 issued Dec. 3, 1996 to Motley et al. entitled METHOD OF PROGRAMMING A DESIRED SOURCE RESISTANCE FOR A DRIVER STAGE discloses an output impedance in a CMOS output driver stage that is programmed and compensated by complementary current mirrors that are MOS devices in series with each of the conventional pull-up and pull-down devices.

U.S. Pat. No. 5,568,084 issued Oct. 22, 1996 to McClure et al. entitled CIRCUIT FOR PROVIDING A COMPENSATED BIAS VOLTAGE discloses a bias circuit for generating a bias voltage for a power supply voltage that comprises a voltage divider to generate a divided voltage based on a power supply value. The divided voltage is applied to a current mirror device which controls a current applied to a linear load device. The voltage across the load device determines the bias voltage.

U.S. Pat. No. 4,533,839 issued Aug. 6, 1985 to Balakrishnan entitled CURENT LIMITING CIRCUIT FOR HIGH CURRENT PERIPERAL DRIVERS discloses a driver circuit including a switching output transistor operated from a digital logic control and provided with a shut off circuit which turns the output transistor off when its collector supply current exceeds its saturation current.

U.S. Pat. No. 5,455,522 issued Oct. 3, 1995 to Jones entitled PROGRAMMABLE LOGIC OUTPUT DRIVER discloses a programmable logic output driver circuit that comprises a bias generator, a current mirror, an output stage and a programming feature to maintain the output voltage slew rate at an acceptable value for either high or low values of load capacitances.

U.S. Pat. No. 5,428,303 issued Jun. 27, 1995 to Pasqualini entitled BIAS GENERATOR FOR LOW GROUND BOUNCE OUTPUT DRIVER discloses a bias generator that includes a bias control signal generator, a current difference circuit with a resistive divider and a down current mirror that drives a final pull-down transistor of an output driver circuit.

SUMMARY OF THE INVENTION

An object of the present invention is to provide an improved off-chip driver circuit for integrated circuits.

Another object of the present invention is to provide an improved off-chip driver circuit using a regulated current mirror output stage.

Still another object of the present invention is to provide an improved off-chip driver circuit with compensated current reference.

A further object of the present invention is to provide an improved off-chip driver circuit using NFET devices to control off-chip driver pulldown.

A still further object of the present invention is to provide an improved off-chip driver circuit using multiple stage current-mirror drive levels.

Other features, advantages and benefits of the present invention will become apparent in the following description taken in conjunction with the following drawings. It is to be understood that the foregoing general description and the following detailed description are exemplary and explanatory but are not to be restrictive of the invention.

The accompanying drawings which are incorporated in and constitute a part of this invention and, together with the description, serve to explain the principles of the invention in general terms. Like numerals refer to like parts throughout the disclosure.

DESCRIPTION OF THE INVENTION

The drive strengths of off-chip driver (OCD) circuits range widely depending on manufacturing process parameters, supply voltage and temperature. The present invention provides an improved OCD circuit that can regulate itself to minimize variations in drive current output voltage slew rate and the rate of change of the current with time (di/dt).

More particularly, the present invention provides an OCD circuit that uses a current-mirror output stage that is controlled by a voltage and a process compensating control circuit.

Figure 1:
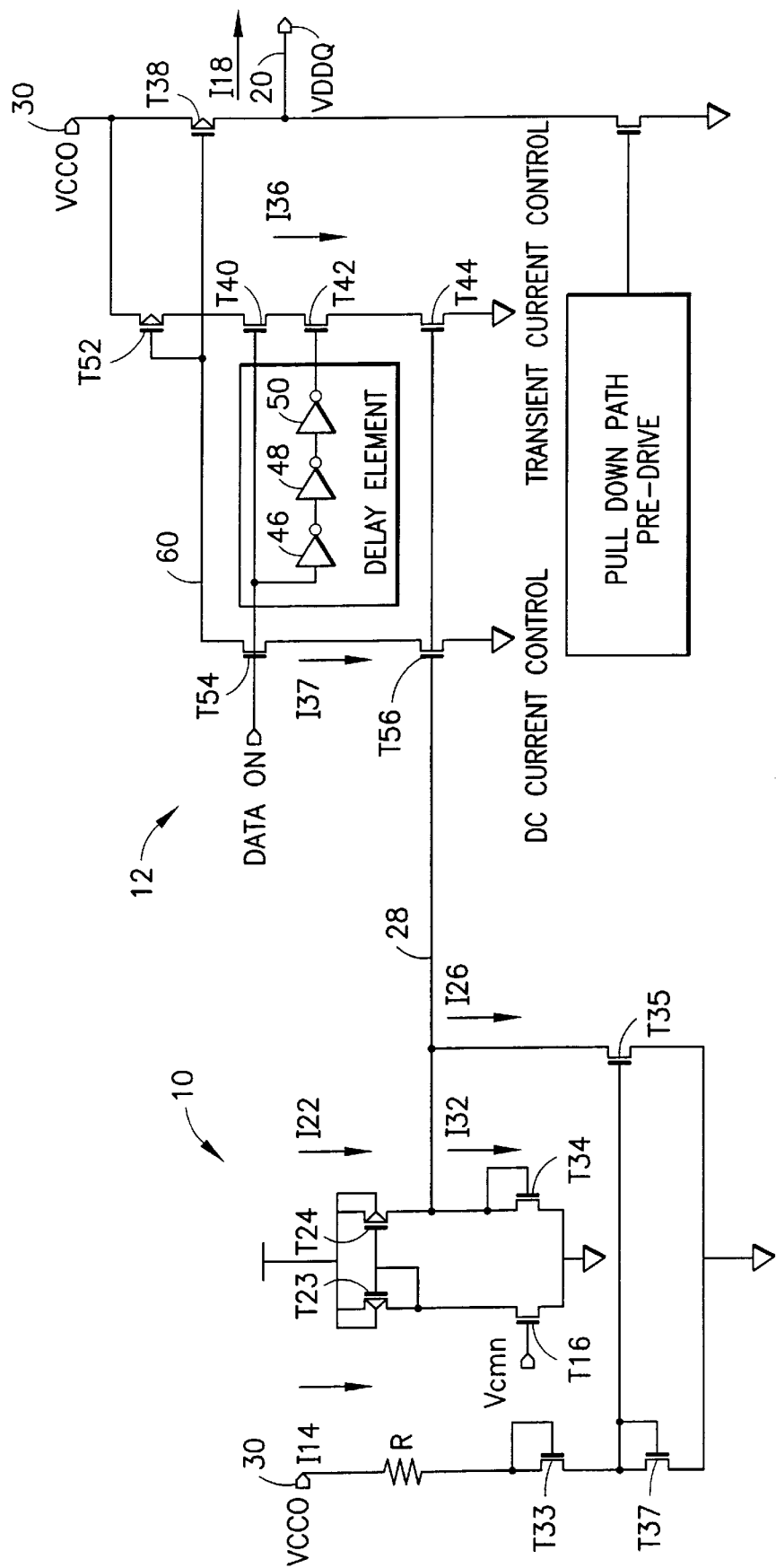
FIG. 1 is a schematic illustration showing an off-chip driver circuit according to the principles of the present invention.

FIG. 1 shows an off-chip driver circuit with a compensated current source including a reference current amplifier 10 and the pull-up section 12 of an output driver. Reference current amplifier 10 includes an input voltage Vcmn from an on-chip current reference source. The on-chip current reference source is a known circuit that has been commonly implemented using band-gap reference techniques and is not shown in FIG. 1 because it does not constitute part of the present invention.

In the reference amplifier, 10 a reference current I14 is established in a first current path 15 by choice of Beta (Beta 1) of transistor T16. A feature of the of the present invention as shown in the circuit of FIG. 1 is that an output current I18 is produced in the output lead 20 of the driver circuit that is proportional to the current I14 in the first current path 15, but with adjustments made for the supply voltage level VCCQ at point 30 and effective transistor channel length, Leff. Current I22 in transistor T24 of a second current path 17 is proportional to current I14 in first current path 15 multiplied by the Beta (Beta24) of transistor T24 in second current path 17 divided by the Beta (Beta23) of transistor T23 in first current path 15. Current I26 is set by voltage (VCCQ−2Vtn)/R multiplied by Beta35/Beta37 where Beta35 is the Beta of transistor 35 and Beta37 is the Beta of transistor 37. Another feature of the present invention as shown in the circuit of FIG. 1 is that a reference current-voltage (Vbias2) is established on lead 28 that is primarily determined by a multiple of the reference current I14, but is reduced by the current I26, which is a function of the supply voltage VCCQ at point 30. With current I32 flowing through transistor T34, the current I36 is set by Beta44/Beta34 multiplied by current I32 where Beta44 is the Beta of transistor T44 and Beta34 is the Beta of transistor T34. Output current I18 is then determined by Beta38/Beta52 multiplied by the current I36 where Beta38 is the Beta of transistor T38 and Beta52 is the Beta of transistor T52 plus Beta38/Beta52×I27.

It can be seen that as the supply voltage VCCQ increases, current I26 increases causing current I32 through transistor I34 to decrease. This effect slows the charge-up time of a capacitive load when supply voltage VCCQ is high and controls its slew rate and limits the rate (di/dt) of change of current I18 to minimize package inductance effects. The reduction in driver output current I18 is a linear function of supply voltage VCCQ and is not a square law dependence as in the prior art. Thus, in the circuit of FIG. 1 of the present invention the output current I18 is reduced linearly and predictably with the supply voltage VCCQ and this feature is largely process independent.

Still another feature of the present invention as shown in FIG. 1 is that the output current I18 is reduced when transistor channel lengths are at the short end of their distribution. This is accomplished by designing the Beta24/Beta23 of the current amplifier with dissimilar Leff. The Beta of a MOS transistor is proportional to 1/Leff, therefore the Beta increases rapidly at small Leff, and by using long Leff in transistor T24 and short Leff in transistor T23, the ratio of Beta23/Beta24 decreases at short Leff. The decrease in Beta ratio reduces the current I22 and therefore the output current I18 is reduced at short Leff. This feature is particularly important in the output voltage range where the transistor T38 goes into the linear device region and no longer behaves as a current mirror and output current and slew rates are more dependent on process parametrics.

FIG. 1 shows two pull down paths to discharge the gate of transistor T38. The first pull down path, as previously described, is used to add a transient output current that cut off when the delay element times out. A second discharge path is used to hold the output current to a predetermined DC level after the first, or transient path has shut off. In the circuit of FIG. 1 two levels of drive are established and "pre-emphasis" is designed into the output current waveform to provide extra current only during the transition of the output voltage VDQ on lead 20.

Faster switching is achieved into resistively terminated loads with the circuit of FIG. 1. The drive stage is activated when lead 60 goes LOW in response to a logic "1" data signal. The gate of transistor T52 is discharged by the aforesaid two paths and activates the output PFET T38 to drive a logical "1". The transient path is formed by transistors T40, T42 and T44 with a timed drive period determined by the three inverters 46, 48 and 50 driving transistor T42. When the transient path shuts off, a maintenance drive current is established by a DC path through transistors T54 and T56 with output current I18 proportional to current I27×(BetaT38/BetaT52).

The transistor devices T40, T42 and T44 in combination with the diode PFET T52 control the current in the output of PFET T38 as a current mirror, with output current proportional to current I36×(Beta T38/Beta T52. It is desirable to maintain the width of transistor T38 small to minimize load capacitance, and this requires a large gate overdrive for transistor T38. This large overdrive requirement causes the gate voltage of transistor 38 to operate near 0.5 volts, making current supply transistor device T44 operate near the edge of its saturation region.

It is necessary to provide a reference current on lead 28 that compensates for the poor current source characteristics of transistor T44 operating at the edge of saturation, and to reduce the current I36 in short channel product. As output transistor device T38 transitions from its current mirror (i.e. saturation region) bias conditions into the linear region, its output current ceases to mirror the reference current and becomes a function of supply voltage VCCQ. A reduction in current is needed when VCCQ is at its maximum value to maintain output slew rate, impedance and di/dt.

Figure 2:
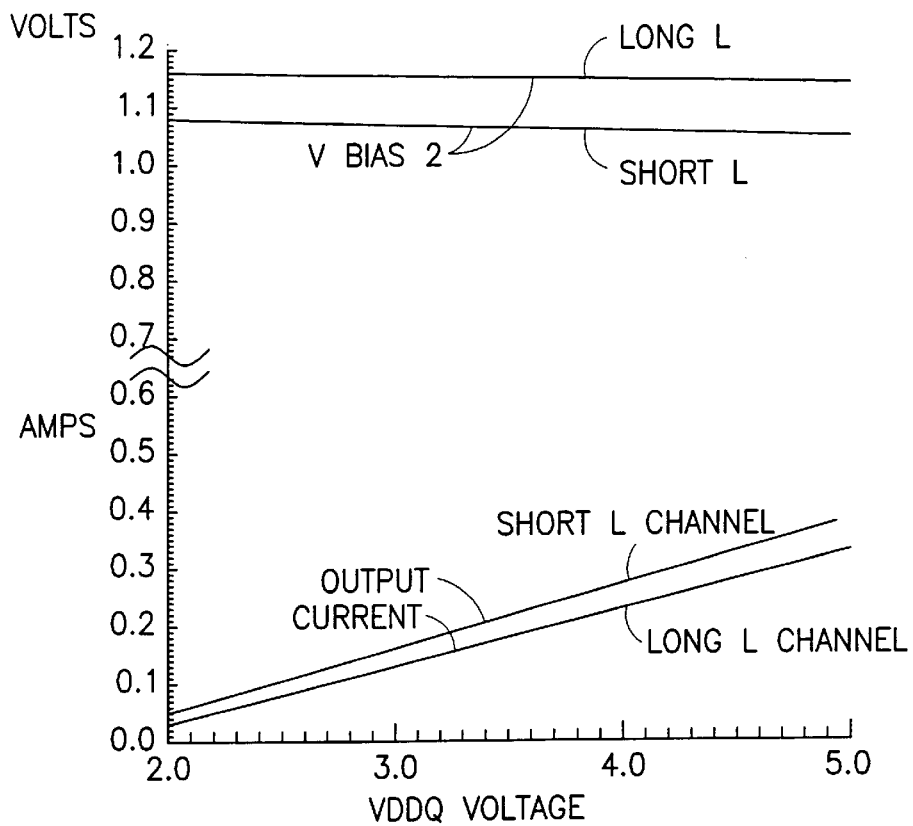
FIG. 2 is an illustration showing the Vbias2 control voltage as a function of voltage VDDQ.

FIG. 2 shows curves of the reference current-voltage Vbias2 vs. supply voltage for long and short channel lengths. FIG. 2 illustrates that Vbias2 decreases at high VCCQ and for short leff. The basic current reference is established through mirroring from an on chip bandgap reference voltage Vcmn used throughout the chip.

Figure 3:
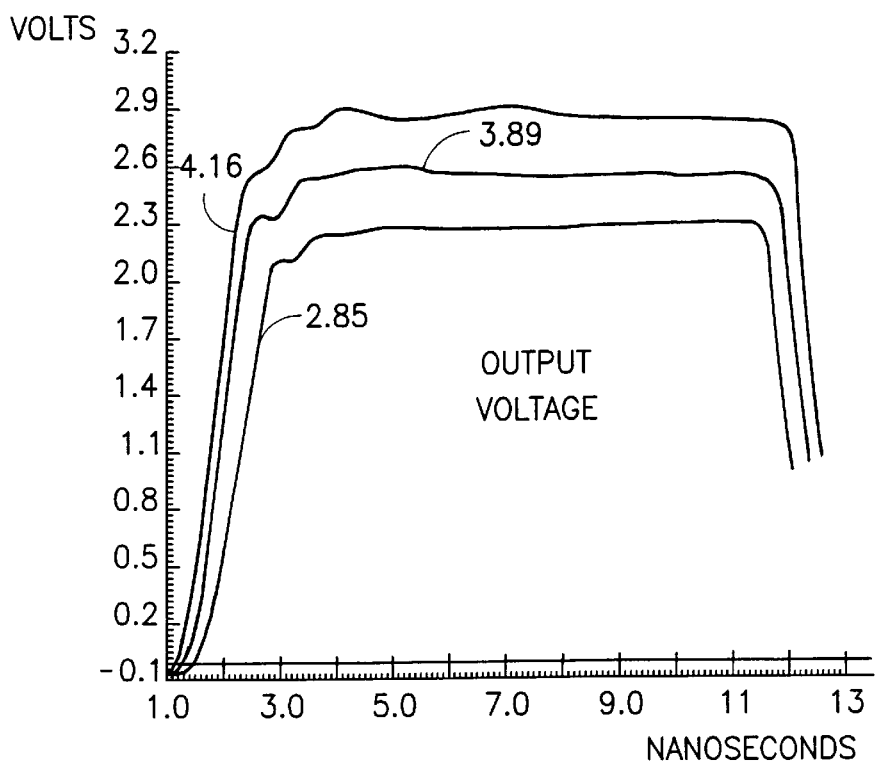
FIG. 3 is a graph showing the improvement in control of the off-chip driver circuit output voltage slew rate according to the principles of the present invention.

FIG. 3 shows curves of the rise in voltage vs. time in nanoseconds for slew rates of 4.16 volts/nanosecond at high supply voltage and fast process, 3.89 volts/nanosecond at nominal and 2.85 volts/nanosecond at low voltage and slow process. From the curves illustrated in FIG. 3, the improvement in control of the output voltage slew rate using the circuit of FIG. 1 can be seen.

What has been described is a regulated current mirror in a memory device to drive an output load at a controlled slew rate, drive level and impedance. A compensated current reference is provided to overcome process tolerances and application voltage differences to maintain a tightly controlled slew rate, drive current and di/dt. Features of the present invention are the use of an NFET dual of the circuit to control OCD pull-down characteristics and the use of multiple stage current mirror drive levels to provide an initial drive level and subsequent drive levels thereafter.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. An off-chip driver circuit for integrated circuits comprising:

a reference current amplifier circuit connected to an input voltage (Vcmn) for providing a reference current, and a reference current-voltage (Vbias2) on an output lead of the reference current amplifier circuit, an output driver circuit including a pull-up circuit stage having an input lead connected to the reference current amplifier circuit output lead and responsive to the reference current-voltage (Vbias2) to produce an output current on an output lead proportional to the reference current provided by the reference current amplifier, wherein the reference current amplifier includes first and second transistor devices connected in series to form a first current path and third and fourth transistor devices connected in series to form a second current path, wherein the reference current from the reference current amplifier flows in the first current path and the reference current has a level that is determined by the Beta of the second transistor of the first current path.

2. The off-chip driver circuit of claim 1 wherein the first transistor device of the first current path and the third transistor device of the second current path have effective channel lengths Leff that are dissimilar.

3. The off-chip driver circuit of claim 1 wherein the output current on the output lead of the output driver circuit is proportional to the reference current in the first current path.

4. The off-chip driver circuit of claim 1 wherein a current flows in the second current path of the reference current amplifier that is proportional to the reference current in the first current path multiplied by the Beta of the third transistor of the second current path divided by the Beta of the first transistor of the first current path.

5. The off-chip driver circuit of claim 1 further including a source of supply voltage (VCCQ) and wherein the reference current amplifier and the pull-up stage of the output driver circuit are connected to the source of supply voltage (VCCQ), and wherein the reference current-voltage (Vbias2) is a multiple of the reference current in the first current path reduced by a function of the supply voltage (VCCQ).

6. The off-chip driver circuit of claim 1 wherein the output driver circuit includes an output transistor device connected to the driver circuit output lead, a delay element for providing a delay signal, and a first and a second pull-down circuit path connected to the gate of the output transistor device to discharge the output transistor, wherein the first pull down path is connected to the delay element and conducts a transient current at the output transistor device for a transient time period and the second pull down path maintains the output current on the driver circuit output lead at a predetermined current level after the end of the transient time period.

7. The off-chip driver circuit of claim 5 further including a delay element for providing a delay signal, fifth and sixth transistor devices connected in series, the fifth transistor device having a gate connected to a data input signal, the sixth transistor device having a gate connected to the delay element and a seventh transistor device connected is series with the fifth and sixth transistor devices and having a gate connected to the output lead of the reference current amplifier circuit and responsive to the reference current-voltage (Vbias2) thereon, the fifth, sixth and seventh series connected transistor devices forming a current path for conducting a transient current having a time period determined by the delay signal from the delay element.

8. The off-chip driver circuit of claim 7 further including an eighth transistor device connected to the fifth transistor device and to the output transistor device wherein the fifth, sixth, seventh and eighth transistor devices control the current in the output transistor device to provide a compensated-current mirror output current level that is proportional to the current flowing in the fifth, sixth and seventh series connected transistor devices.

9. The off-chip driver circuit of claim 8 further including a ninth and a tenth transistor device connected in series to the gate of the fourth transistor device and the gate of the output transistor device to provide a maintenance drive current path that is established by a DC path through the ninth and tenth transistor devices for conducting a maintenance current when the transient current flowing through the fifth, sixth and seventh transistor devices ends.

10. The off-chip driver circuit of claim 1 wherein the reference current amplifier and the pull-up stage of the output driver circuit are connected to a source of supply voltage (VCCQ), and wherein the reference current-voltage (Vbias2) on the output lead from the reference current amplifier is adjusted in response to a change in the supply voltage (VCCQ) connected to the reference current amplifier.

11. The off-chip driver circuit of claim 10 wherein the reference current amplifier is connected to the source of supply voltage (VCCQ) through a resistive element and an eleventh and a twelfth transistor device connected in series to the output lead from the reference current amplifier, and wherein a current through the eleventh transistor device is increased by an increase change in the supply voltage (VCCQ).

12. The off-chip driver circuit of claim 11 wherein the increased current through the eleventh transistor device is mirrored to a thirteenth transistor device to reduce the current flowing through the fourth transistor device of the second current path to provide a linear relationship between the supply voltage (VCCQ) and the reference-current voltage (Vbias2).

* * * * *